| United States Patent [19] | [11] Patent Number: 4,715,063 |
| Haddad et al. | [45] Date of Patent: Dec. 22, 1987 |

[54] SPEAKERPHONE FOR RADIO AND LANDLINE TELEPHONES

[75] Inventors: Kenneth R. Haddad, Schaumburg; Richard J. Vilmur, Palatine, both of Ill.

[73] Assignee: Motorola, Inc., Schaumburg, Ill.

[21] Appl. No.: 889,301

[22] Filed: Jul. 21, 1986

Related U.S. Application Data

[63] Continuation-in-part of Ser. No. 767,543, Aug. 20, 1985, abandoned.

[51] Int. Cl.⁴ .............................................. H04M 9/08
[52] U.S. Cl. ...................................... 379/390; 379/388
[58] Field of Search ................ 179/81 B, 170.2, 170.6, 179/170.8; 379/388, 389, 390, 406, 409

[56] References Cited

U.S. PATENT DOCUMENTS

| 3,751,602 | 8/1973 | Breeden | 379/389 |
| 3,925,618 | 12/1975 | Kato et al. | 379/389 |
| 3,952,166 | 4/1976 | Kato et al. | 379/389 |
| 4,378,603 | 3/1983 | Eastmond | 455/79 |
| 4,400,584 | 8/1983 | Vilmur | 379/61 X |
| 4,513,177 | 4/1985 | Nishino et al. | 379/389 |

*Primary Examiner*—Jin F. Ng
*Assistant Examiner*—R. Vaas
*Attorney, Agent, or Firm*—Rolland R. Hackbart

[57] ABSTRACT

Improved speakerphones (120 and 130 in FIG. 1) for both radio (112) and landline (138) telephones are described. The improved speakerphones (120 and 130) each include a microphone (102 and 132), a speaker (104 and 134) and unique control circuitry (106 and 136). The control circuitry of the improved speakerphone (200 in FIG. 2) interfaces a microphone (250) to a transmit signal (220) and speaker (260) to a receive signal (222) of a duplex communication path, such as a radio channel or telephone line. Variable gain stages (212 and 202) amplify and attenuate the speaker and microphone audio paths, respectively, in response to a gain control signal (223) from control logic (230). Transmit and receive signal detectors (206 and 207), each include gain adjust circuitry (208) a logarithmic amplifier (240), an envelope detector (241), a smoothing filter (245), a valley detector (242), a summer (243) and a comparator (244) for detecting the presence of audio signals in environments that may be subject to high background noise. Binary output signals from the transmit and receive signal detectors (206 and 207) are applied to control logic (230) which generates the gain control signal (223) and detector control signal (224). The control logic (230) includes delay circuitry (316 and 318) and gain control circuitry (392) for generating the gain control signal (223), the magnitude of which varies the amount of gain stages (202 and 212). Delay circuitry (316 and 318) and logic circuitry (304, 306, 308, 310, 312 and 314) in control logic (230) set and reset a flip-flop (302) for generating the detector control signals (224 and 225). Detector control signals (224 and 225) are coupled to gain adjust circuitry (208) and smoothing filter (245) for adjusting gain and response time of transmit and receive signal detectors (206 and 207).

6 Claims, 8 Drawing Figures

SPEAKERPHONE FOR RADIO AND LANDLINE TELEPHONES

This is a continuation-in-part of application Ser. No. 767,543, filed on Aug. 20, 1985 and now abandoned.

BACKGROUND ART

The present invention relates generally to speakerphones, and more particularly to an improved speakerphone that can advantageously be utilized in both radio and landline telephone systems.

In both radio and landline telephone systems, a user communicates by means of a handset that includes a speaker at one end which is placed close to the user's ear and a microphone at the other end which is held close to the user's mouth. Thus, the user has only one free hand since the other must be used to hold the telephone handset. In order to provide a greater degree of freedom to the user, speakerphones have been developed for use in landline telephone systems. A conventional speakerphone is typically coupled to the telephone line and when enabled allows the hands-free party user to freely move about while still communicating with another party. Such speakerphones typically compare the volume of the hands-free party and the other party and select the party speaking the loudest. Furthermore, conventional speakerphones, such as that described in U.S. Pat. No. 3,751,602, always revert to the listen mode a short time interval after the hands-free party stops talking. However, conventional speakerphones suffer from a number of problems including inability to accommodate high ambient noise environments and breakup due to feedback from the speaker to the microphone when the speaker amplification has been turned up. These conventional speakerphones work reasonably well when utilized with landline telephones in relatively quiet surroundings, but may not operate correctly when used in noisy environments and especially when used with a radio due to the high degree of ambient noise encountered in vehicles. For example, a high level of ambient noise may cause such speakerphones to always select the hands-free party.

The problem of accomodating a high degree of ambient noise has been addressed in the speakerphones described in U.S. Pat. Nos. 4,378,603 and 4,400,584 by selecting only one of the parties while totally muting the other party, and switching between parties using the output of audio signal detectors that detect the presence of audio signals only when the audio signals exceed the background noise by a predetermined amount. Another prior art speakerphone totally ignores the hands-free party and always selects the other party whenever audio signals from the other party are detected.

However, none of these prior art speakerphones accomodates both a noisy environment and allows the hands-free party to break in relatively easily on the other party. Accordingly, there is a need for an improved speakerphone that can accomodate noisy environments and allow the hands-free party to break in relatively easily on the other party.

SUMMARY OF THE INVENTION

Accordingly, it is a general object of the present invention to provide an improved speakerphone that allows hands-free voice communications in environments having high levels of ambient noise.

It is yet another object of the present invention to provide an improved speakerphone for radiotelephones where voice path gain switching between the hands-free party and the other party is primarily dependent upon the presence or absence of audio signals from the other party and voice detector sensitivity switching is dependent upon the last party to speak.

Briefly described, the improved speakerphone of the present invention is coupled to a microphone, speaker and communications path for applying to said path microphone audio signals and applying incoming audio signals from said path to the speaker. The novel speakerphone includes first and second amplifiers having variable gains for amplifying the incoming audio signals and the microphone audio signals by substantially equal but opposite amounts of gain, respectively, in response to a gain control signal; first and second detectors each having a sensitivity varying oppositely from each other by pre-selected amounts in response to a detector control signal for detecting the presence of the incoming audio signals and microphone audio signals, respectively, and producing an output signal; and control circuitry for generating the gain control signal in response to the first detector output signal and generating and storing the detector control signal in response to the first and second detector output signals and the previously stored detector control signal.

DETAILED DESCRIPTION OF THE PREFERRED EMBODIMENT

Figure 1:
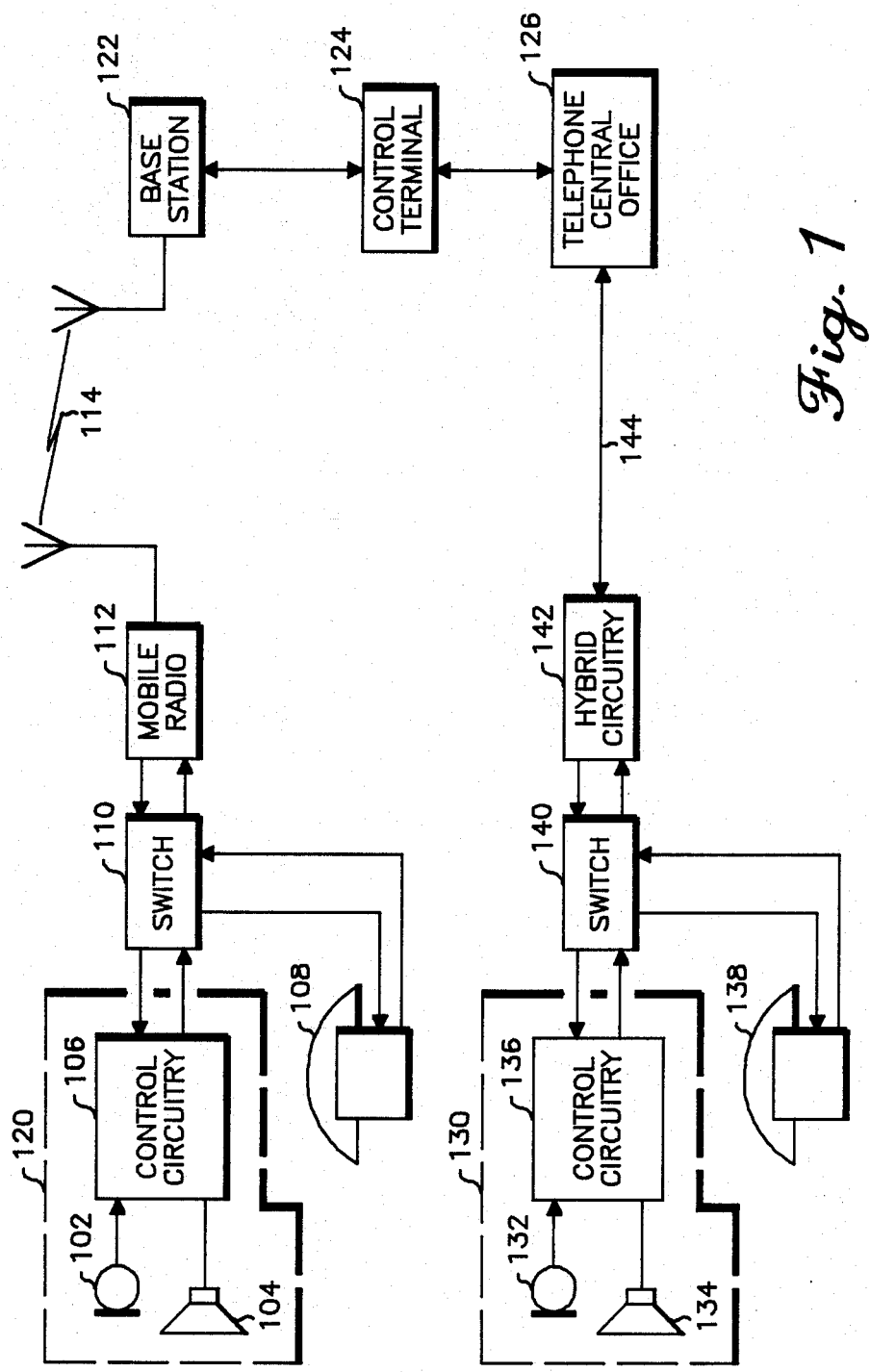
FIG. 1 is a block diagram of a communication system including radio and landline telephones that may advantageously utilize the improved speakerphone embodying the present invention.

In FIG. 1, there is illustrated a communications system including radio telephones 108 and landline telephones 138 that may advantageously utilize the improved speakerphone 120 and 130 embodying the present invention. In conventional radiotelephone systems, such as IMTS (Improved Mobile Telephone Service) and cellular radiotelephone systems, a party in a vehicle communicates by way of mobile telephone 108 and mobile radio 112 with a base station 122 which is interconnected by a control terminal 124 to a landline telephone central office 126. The control terminal 124 includes control circuitry that provides a communication path from the base station 122 to hybrid circuitry (not shown) which is interconnected to a telephone line or trunk of telephone central office 126. A number dialed by the mobile party by means of mobile telephone 108, is received by the control terminal 124 and forwarded to the telephone central office 126 on the telephone line or trunk. The telephone central office 126 receives the dialed telephone number and routes the mobile party to the desired land party telephone, e.g., to landline telephone 138. A similar process is employed when a land party dials the number of a mobile party by means of conventional telephone 138. Furthermore, such communications systems may also include portable radios of the type described in U.S. Pat. Nos. 3,906,166, 3,962,553 and 4,486,624 and in an article by Albert J. Leitich and Donald C. Linder, entitled "Portable Radiotelephone for Cellular Systems", published in the Proceedings of the 30th Annual Conference of the IEEE Vehicular Technology Society, Sept. 15–17, 1980, Dearborn, Mich. Such portable radios can be carried by the user and operated wherever he may be, for example, from his office or his vehicle, and can likewise include the improved speakerphone of the present invention. Further details of the signalling process and the nature of the circuitry for control terminal 124 is provided in Motorola Service Manual 68P81028E65; for the base station 122 in Motorola Service Manual 68P81033E10; for portable radio 112 in Motorola Service Manual 68P81046E60; and for mobile radio 112 and mobile telephone 108 in Motorola Service Manuals 68P81039E25, 68P81029E65 and 68P81037E85, all of which are published by and available from Motorola Service Publications, Schaumburg, Ill.

In order to provide a mobile party with the same type of telephone service that a land party receives, it is necessary that each radio channel 114 be a duplex radio channel, having a separate transmit frequency and a separate receive frequency. Thus, mobile radio 112 may be simultaneously transmitting on one frequency and receiving on the other, such that both the mobile and land parties may simultaneously talk and listen. Mobile telephone 108 may include a handset that is similar to handsets typically found in conventional land-line telephone instruments. During a telephone conversation, it is necessary that the mobile party hold the handset up to his ear just as a land party does. However, it would be much safer and convenient for the mobile party if the conversation during a telephone call could be achieved without the necessity of any physical actions. By utilizing the improved speakerphone 120 of the present invention, a mobile party can converse with a land party for the duration of a call with no required physical action, thus freeing the mobile party of tasks which would interfere with the safe operation of his vehicle. The improved speakerphone 120 of the present invention, together with a mobile telephone 108 such as that described in U.S. Pat. Nos. 4,122,203, 4,220,820 and 4,486,624 which provides for on-hook automatic dialing of telephone numbers stored in a memory, allows a mobile party to safely make telephone calls without the necessity of removing one of his hands from the steering wheel for the duration of the call. In FIG. 1, speakerphone 120, including microphone 102, speaker 104 and control circuitry 106, is switchably coupled to mobile radio 112 by switch 110. Switch 110 selectively couples a transmit signal and a receive signal from mobile radio 112 to either speakerphone 120 or mobile telephone 108.

In landline applications, the improved speakerphone 130 of the present invention can likewise be used to allow total freedom of movement during conversations and multi-party conference calls. In FIG. 1, speakerphone 130, including microphone 132, speaker 134 and control circuitry 136, can be switchably coupled to hybrid circuitry 142 and thereafter to telephone line 144 by means of switch 140. Switch 140 selectively couples a transmit signal and a receive signal from hybrid circuitry 140 to either speakerphone 130 or a conventional telephone 138. Hybrid circuitry 142 may be any suitable commercially available device for interfacing a transmit signal and receive signal to telephone line 144. Furthermore, there are commercially available telephones 138 that provide for on-hook automatic dialing of telephone numbers stored in memory.

In order to provide for hands-free operation, speakerphones 120 and 130 include a separate microphone 102 and 132, a separate speaker 104 and 134, and control circuitry 106 and 136. Alternatively, the microphone and speaker in the handset of telephones 108 and 138 could be utilized if properly designed and oriented with respect to the hands-free party. In most radio and landline applications, it is advantageous to utilize a separate microphone 102 and 132 for receiving the hands-free party's speech. By experimentation, it has been found that the best mounting location for microphone 102 in a vehicle is on the interior roof lining of the automobile either on the visor or just before the edge of the visor. This location has been found to maximize voice pick-up while minimizing background noise pick-up. In addition this microphone mounting location also provides some degree of inherent vibration damping. Experimentation has also been determined that an omni-directional electret microphone cartridge provides good performance while at the same time being cost effective. Also, for vehicular applications, speaker 104 can be located on the dashboard of the vehicle or on the deck near the rear window of the vehicle. In landline applications, microphone 132 and speaker 134 may also be spacially separated and/or differently oriented to reduce the coupling therebetween.

Figure 2:
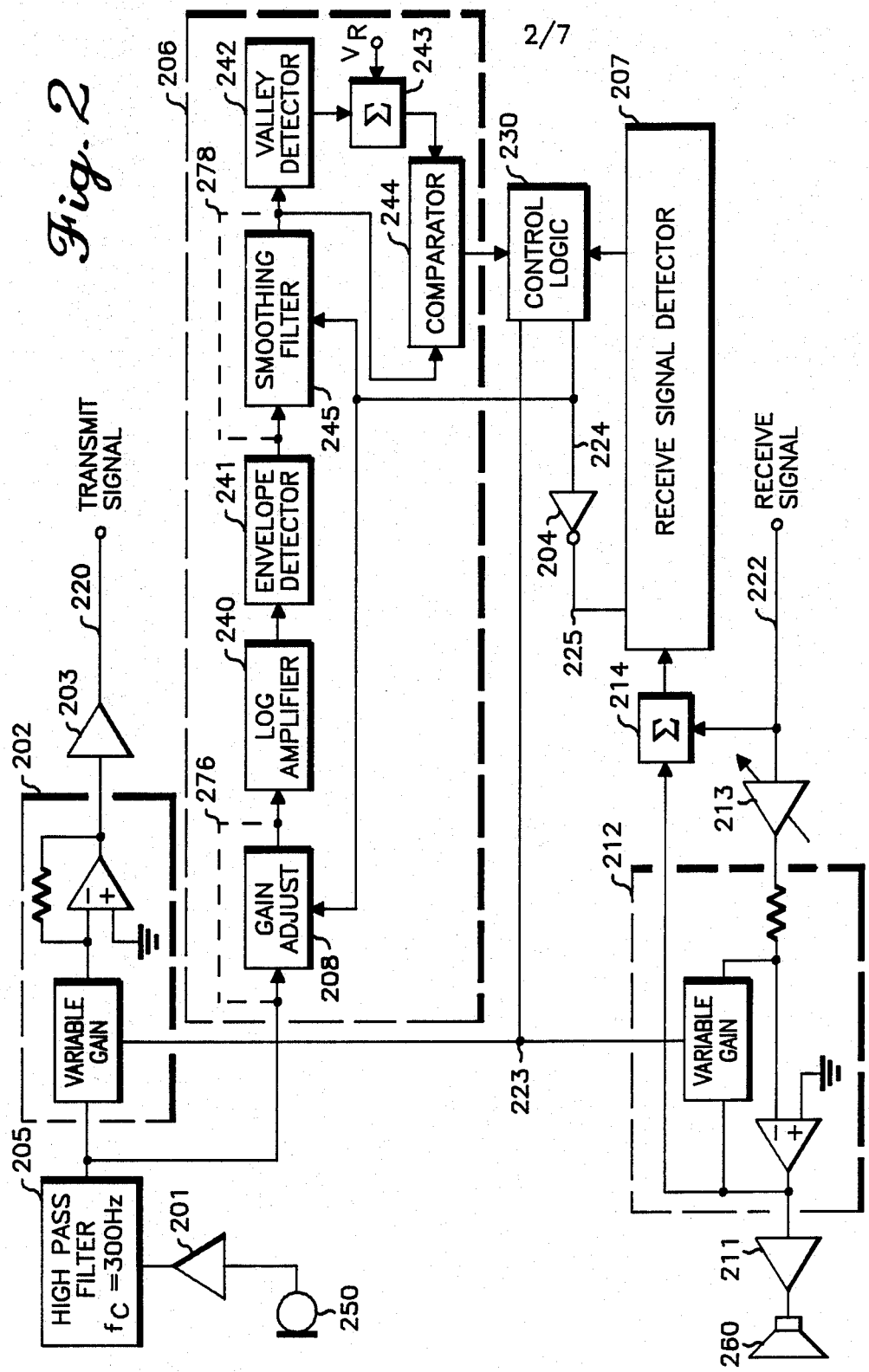
FIG. 2 is a detailed block diagram of the improved speakerphone of the present invention.

Referring to FIG. 2, there is illustrated a detailed block diagram of an improved speakerphone 200 embodying the present invention, which interfaces microphone 250 and speaker 260 to a transmit signal 220 and a receive signal 222, respectively, of a duplex communications path. According to a feature of speakerphone 200, two variable gain stages 202 and 212 are included which dynamically vary the amplification of audio signals from the microphone 250 or from receive signal 222, respectively, in response to a gain control signal 223 from control logic 230. The magnitude of gain control signal 223 linearly varies the gains of stages 202 and 212 in substantially equal but opposite amounts as measured in decibels. That is, as the gain of stage 212 increases, the gain of stage 202 decreases, and vice versa. Since gain stages 202 and 212 produce opposite but substantially equal changes in the amount of gain, stages 202 and 212 could be interchanged as long as the sense of the gain control signal 223 is changed. The magnitude of gain control signal 223 is primarily dependent on the output signal from receive signal detector 207. In the preferred embodiment, the gain control signal 223 is a current generated by control logic 230. Also, each of the audio paths includes fixed gain stages, 201 and 203 in the microphone audio path and 211 and 213 in the speaker audio path. Amplifier 213 in the speaker audio path preferrably has an adjustable gain which may be manually adjusted by the hands-free party for controlling the volume of speaker 112.

The audio signals in the microphone audio path are coupled from amplifier 203 to transmit signal 220 for application to the communication path, which may be a duplex radio channel 114 or a telephone line 144 in FIG.

1. Audio signals received from the communication path are selectively coupled by receive signal 222 to amplifier 213 in the speaker audio path. In radio applications, the transmit signal 220 is coupled to the transmitter, and the receive signal 222 is coupled to the receiver, of a mobile or portable radio, such as radio 112 in FIG. 1. In landline applications, the transmit signal 220 is coupled to the transmit input, and the receive signal 222 is coupled to the receive output, of conventional hybrid circuitry 142 in FIG. 1, which interfaces telephone 138 to its associated telephone line 144.

The novel speakerphone 200 in FIG. 2 also includes transmit and receive signal detectors 206 and 207 having sensitivity switching for detecting the presence of the hands-free party's voice signals and the other party's voice signals, respectively. If microphone 250 does not provide a high-pass response, a high-pass filter 205 may be interposed between microphone 250 and transmit signal detector 206. The microphone signal is high-pass filtered by filter 205 in order to remove low frequency background noise typically present in the vehicular environment. A high-pass filter 205 having a cut off frequency of approximately 300 Hz will filter out most of this low frequency background noise. Similar high-pass filtering may also be added to the receive signal path 222. Furthermore, in applications that are not characterized by such low frequency background noise, a high-pass filter 205 may not be required in either audio path.

The transmit and receive signal detectors 206 and 207 include substantially identical circuit blocks 208–245. Both detectors 206 and 207 are comprised of conventional circuit blocks including gain adjust circuitry 208, a logarithmic amplifier 240 (commonly referred to as a "soft" limiter), an envelope detector 241, a smoothing filter 245, a valley detector 242, a summer 243 and a comparator 244. The gain adjust circuitry 208 varies the gain between two pre-selected levels dependind on the binary state of detector control signal 224 (225 for detector 207). The logarithmic amplifier 240 extends the dynamic range of the detectors 206 and 207 due to its amplification characteristic. The envelope detector 241 provides an output signal which follows the maxima and minima, or envelope, of the audio signals. The smoothing filter 245 provides variable bandwidth low-pass filtering depending on the binary state of detector control signal 224 (225 for detector 207). Gain adjust circuitry 208 and smoothing filter 245 may be bypassed when not utilized by jumpers 276 and 278, respectively. The valley detector 242 operates as a rectifier which follows the minima of the smoothing filter output. The valley detector output essentially corresponds to the steady state background noise present on the transmit signal 220 in the case of detector 206 or on the receive signal 222 in the case of detector 207. Summer 243 adds a reference voltage $V_R$ to the valley detector output. By adding reference voltage $V_R$ to the valley detector output, comparator 244 will not generate spurious output signals due to low amplitude variations of background noise. Thus, the comparator 244 will only provide an output signal if the smoothing filter/envelope detector output exceeds the steady state background noise by the magnitude of reference voltage $V_R$. Reference voltage $V_R$ is chosen together with the response characteristics of the envelope detector 241 and smoothing filter 245 so as to avoid generation of spurious comparator output signals due to low amplitude variations of the background noise. The output signal from comparator 244 has a high voltage level, or binary one state, when the smoothing filter/envelope detector output exceeds the valley detector output by reference voltage $V_R$ and otherwise has a low voltage level, or binary zero state. A binary one state of the output signal from comparator 244 in detector 206 into control logic 230 indicates that audio signals from microphone 250 have been detected, and a binary one state from the comparator 244 in detector 207 into the control logic 230 indicates that audio signals from the receive signal 222 have been detected.

Summer 214 in FIG. 2 applies to receive signal detector 207 a signal that is the sum of both the audio signals from the receive signal 222 and the audio signals from gain stage 212. Amplifier 213 has an adjustable gain control to allow the hands-free party to manually adjust the volume of speaker 260. Thus, the signal applied by summer 214 to detector 207 varies as the volume of speaker 260 is varied. In other embodiments, the inputs of summer 214 may be coupled to receive signal 222 and the output of amplifier 213. Allowing the signal level applied to detector 207 to increase as the volume of speaker 260 increases, and vice versa, helps to maintain a balance between the signal levels applied to the receive signal detector 207 and transmit signal detector 206. As a result, the voice detect sensitivities of detectors 206 and 207 are substantially equalized over the volume range of the speaker 2!0. This feature of speakerphone 200 avoids unnecessary sensitivity switching between the transmit audio path and receive audio path. In addition, this feature insures that an increase in the volume of speaker 260 does not make it more difficult for the hands-free party to keep the transmit audio path in the higher gain state.

The control logic 230 in FIG. 2 is responsive to the output signals from the transmit and receive signal detectors 206 and 207 for switching the gain in the transmit and receive voice paths and the sensitivity of voice detectors 206 and 207. The control circuitry 230 provides a gain control signal 223 for controlling the amount of gain in gain stages 202 and 212, and detector control signals 224 and 225 for controlling the amount of sensitivity in the transmit and receive signal detectors 206 and 207, respectively.

Figure 3:
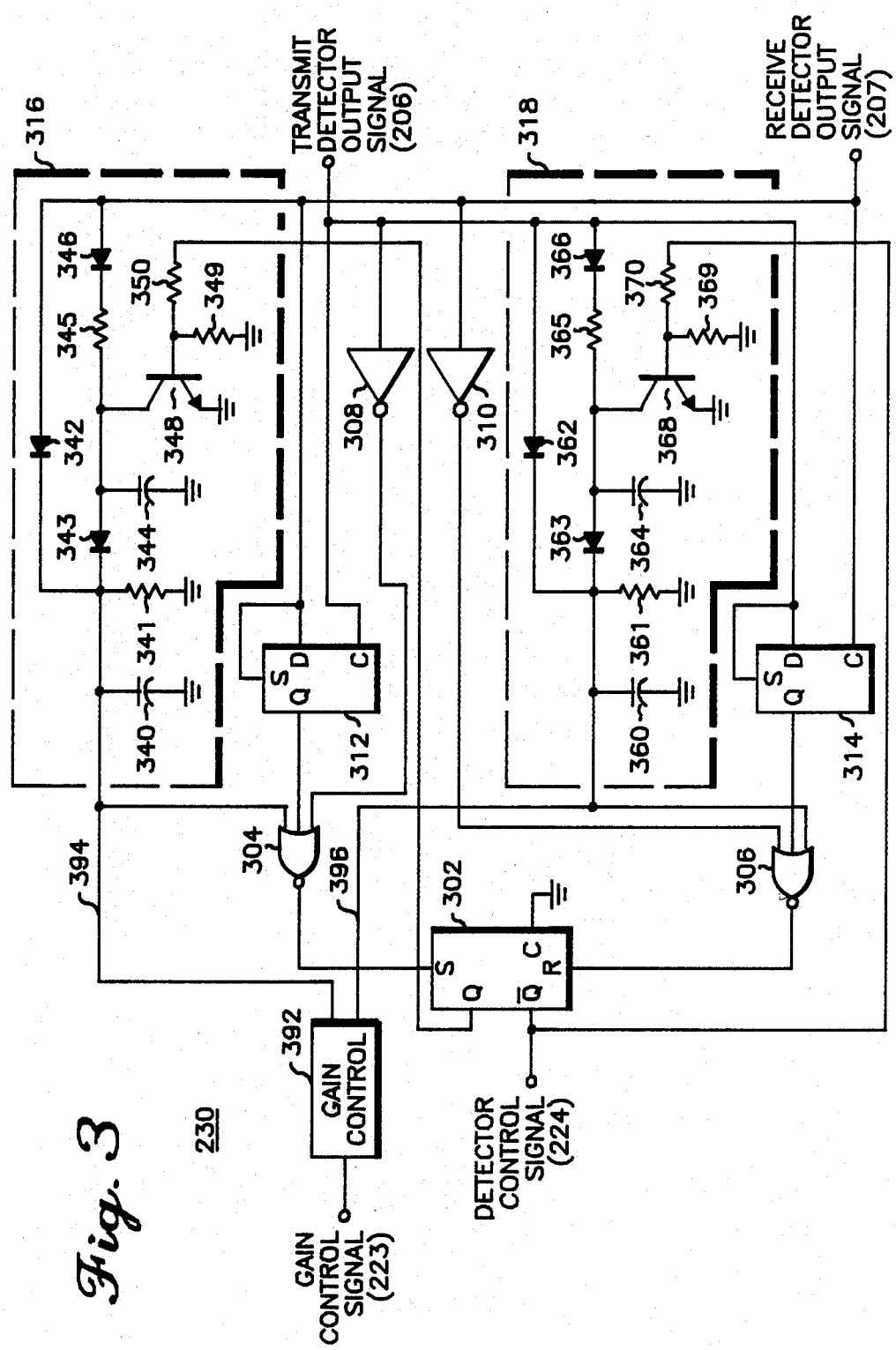
FIG. 3 is a detailed circuit diagram of the control logic 230 in FIG. 2.

The control logic 230 in FIG. 2 is illustrated in more detail in the circuit diagram in FIG. 3. In FIG. 3, gain control signal 223 for variable gain stages 202 and 212 is provided by gain control circuit 392. When the magnitude of the gain control signal 223 from gain control circuitry 392 is low, the audio signals from microphone 250 are passed by variable gain stage 202 with a low amount of gain and the audio signals from receive signal 222 are passed by variable gain stage 212 with a high amount of gain. When the magnitude of gain control signal 223 is high, the opposite is true. In the preferred embodiment the gain control signal 223 comes from a current source output, so low current represents a low magnitude for gain control signal 223.

In FIG. 3, detector control signal 224 for detector 206 and detector control signal 225 for detector 207 in FIG. 2 is provided by the $\overline{Q}$ output of flip-flop 302 and the output of gate 204, respectively. When detector control signal 224 has a binary zero state (225 has a binary one state), gain adjust circuitry 208 and smoothing filter 245 have a higher gain and quicker response time which results in a greater amount of sensitivity in transmit signal detector 206 than in receive signal detector 207. When detector control signal 224 has a binary one state, gain adjust circuitry 208 and smoothing filter 245 have a higher gain and quicker response time in receive signal detector 207 than in transmit signal detector 206. As previously indicated, the preferred embodiment does not include gain adjust circuitry 208 in transmit signal detector 206 and does not include smoothing filter 245 in receive signal detector 207.

Referring to FIG. 3, the $\overline{Q}$ output (detector control signal 224) of the flip-flop 302 will be set to a binary zero state (low voltage level) when NOR gate 304 has a binary one state (high voltage level). NOR gate 304 provides a binary one state at its output when the output signal from detector 206 changes to a binary one state indicating that the hands-free party's speech has been detected, the held receive signal detector output signal 394 has reached a binary zero state after a time interval defined by delay circuitry 316, and the output of flip-flop 312 has a binary zero state. The $\overline{Q}$ output (detector control signal 224) of flip-flop 302 will be set to a binary one state when NOR gate 306 has a binary one state. NOR gate 306 provides a binary one state at its output when the held transmit signal detector output signal 396 reaches a binary zero state, which means that the output signal from detector 206 has had a binary zero state for a time interval defined by delay circuitry 318, the Q output of flip-flop 314 has a binary zero state, and the output signal from the receive signal detector 207 has a one state.

Delay circuitry 316 and 318 in FIG. 3 both have fast charge paths provided by diodes 342 and 362, respectively. Thus, when the output signal from transmit signal detector 206 changes to a binary one state, diode 362 bypasses components 363, 365 and 366 so that capacitor 360 quickly charges to a high voltage level. Likewise, when the output signal from receive signal detector 207 changes to a binary one state, diode 342 bypasses components 343, 345 and 346 so that capacitor 340 quickly charges to a high voltage level. Both delay circuitry 316 and 318 provide delay time intervals for output signals 394 and 396 when discharging from a high voltage level to a low voltage level in response to changes of the output signals from detectors 207 and 206, respectively, from a binary one state to a binary zero state.

The time intervals for the delay circuitry 316 and 318 is a compromise which reflects conflicting requirements for fast sensitivity switching and minimum degradation of operational characteristics in the presence of high background noise. The time intervals for delay circuitry 316 and 318 include a fixed time interval and a variable time interval having a magnitude dependent on the duration of the output signal from detectors 207 and 206, respectively. In the preferred embodiments, delay circuitry 316 and 318 provide a short time interval of approximately 10 milliseconds for output signals from detectors 207 and 206 having a short duration; and provide a variable time interval ranging from zero to approximately 130 milliseconds for output signals from detectors 207 and 206 having a long duration. The time interval provided by delay circuitry 316 and 318 will, therefore, vary between a minimum of 10 milliseconds and maximum of 140 milliseconds. Furthermore, by proper design of delay circuitry 316 and 318, the time interval can be chosen to be proportional to the duration of the output signal from detectors 207 and 206 over the range from 10 milliseconds to 140 milliseconds.

In general, the time interval of delay circuitry 316 and 318 may vary from 5 to 400 milliseconds depending upon the requirements of a particular application of the speakerphone of the present invention. A predetermined minimum amount of time delay, such as 5 to 10 milliseconds, is always necessary to avoid spurious sensitivity switching caused by signal delay through the communications network, i.e. the control terminal 124 and telephone central office 126, at the cessation of either party's speech.

In the preferred embodiment of a landline speakerphone, capacitor 340 and resistor 341 in delay circuitry 316, and capacitor 360 and resistor 361 in delay circuitry 318, have a time constant of approximately 10 milliseconds, while capacitor 344 and resistor 341 in delay circuitry 316, and capacitor 364 and resistor 361 in delay circuitry 318, have a time constant of approximately 130 milliseconds. This selection of time constants provides a fixed time delay of approximately 10 milliseconds and a variable time delay of from 0-130 milliseconds in the preferred embodiment of delay circuitry 316 and 318. The proportionality between the variable time delay of capacitor 344 and resistor 341 of delay circuitry 316 and the duration of the receive detector output signal 207 is controlled by the time constant of capacitor 344 and resistor 345 which can range from 30 to 150 milliseconds depending on the environment of the application and is 68 milliseconds in the preferred embodiment of a landline speakerphone. Likewise capacitor 364 and resistor 365 of delay circuitry 318 control the proportionality of the variable time delay with respect to the duration of the transmit detector output signal 206.

The foregoing features of the speakerphone 200 facilitate switching the state of detector control signal 224 when short bursts of audio signals are occurring on the audio path presently having higher sensitivity. If these bursts are relatively short, sensitivity switching can occur during pauses between speech bursts, since the time interval of the delay circuitry 316 or 318 is also rather short under such conditions.

According to another feature of speakerphone 200, detector control signal 224 may change state only when the presently speaking party has not provided sufficient audio activity to maintain a detector output signal 206 or 207. Flip-flops 312 and 314 are used to provide this feature. Assuming all other inputs to NOR gate 304 or 306 have binary zero state, break-in takes place if the Q output of flip-flop 312 or 314, respectively, momentarily has a binary zero state. For example, the Q output of flip-flop 312 will have a binary zero state when the receive signal detector output signal 207 has a binary zero state (no audio signals being detected on the receive signal 222) and the transmit signal detector output signal 206 thereafter changes state from a binary zero state to a binary one state (indicating that the hands-free party is starting to speak). Flip-flop 314 operates in a similar manner. This operation of flip-flops 312 and 314 allows detector control signal 224 to change only if the detector output signal of the presently speaking party changes state and the detector output signal of the other party thereafter changes state. The major reason for this feature is to prevent spurious post syllabic sensitivity switching caused by near simultaneous detector outputs which are due to sidetone in control terminal 124 or telephone central office 126 in FIG. 1 and sidetone due to speaker to microphone coupling in the speakerphone.

Figure 4:
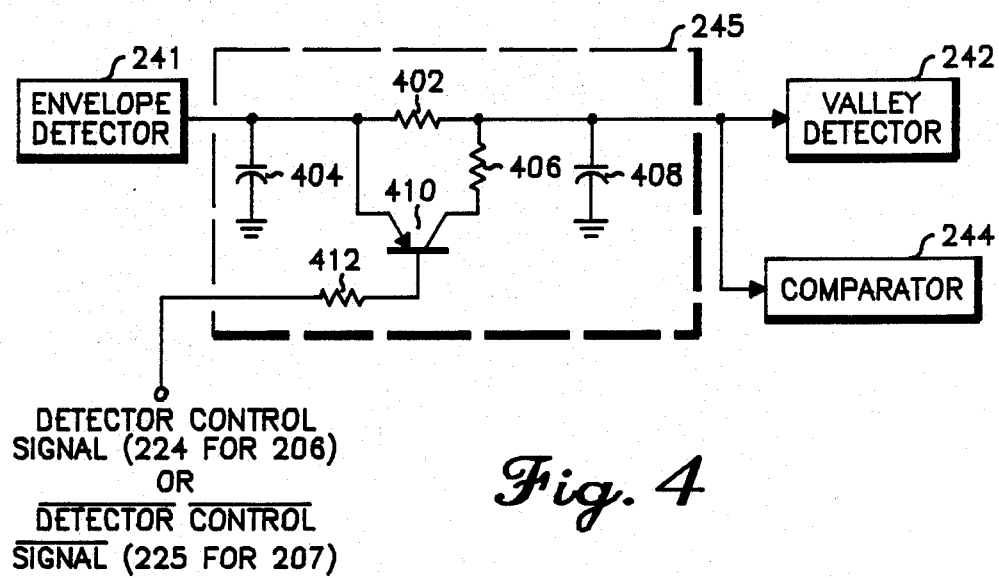
FIG. 4 is a detailed circuit diagram for the smoothing filter 245 in FIG. 2.

According to yet another feature of speakerphone 200, smoothing filter 245 in FIG. 4 may be included in detectors 206 and 207 in FIG. 2 for increasing the smoothing in the microphone audio path when the speaker audio path has the higher gain, and vice versa. This feature of the present invention minimizes syllabic attack time chopping due to sidetone in control terminal 124 or telephone central office 126 in FIG. 1 and sidetone due to speaker to microphone coupling in the speakerphone. In the preferred embodiment, smoothing filter 245 is bypassed by jumper 278 in receive signal detector 207. Referring to FIG. 4 smoothing filter 245 includes capacitors 404 and 408, resistors 402, 406 and 412 and transistor 410. Transistor 410 is turned on in response to a binary zero state of the detector control signal 224 in FIG. 2 in the case of detector 206 and a binary zero state of the $\overline{\text{detector control signal}}$ 225 in the case of detector 207. When transistor 410 turns on, resistor 406 is coupled in parallel with resistor 402, lowering effective magnitude of the resistance in the path between envelope detector 240 and both valley detector 242 and comparator 244. As a result, the sensitivity of detector 206 or 207 is increased by a preselected amount since the signal gain is increased and the response time is lowered when transistor 410 turns on. The effect of this feature of speakerphone 200 is that the detect gain and response time of one of detectors 206 or 207 is greater than the other even though the audio signal level applied to the other may be higher. Thus, if $\overline{\text{detector control signal}}$ 225 has a binary zero state, receive signal detector 207 has the higher gain and faster response time; and if detector control signal 224 has a binary zero state, transmit signal detector 206 has the higher gain and faster response time.

Figure 5:
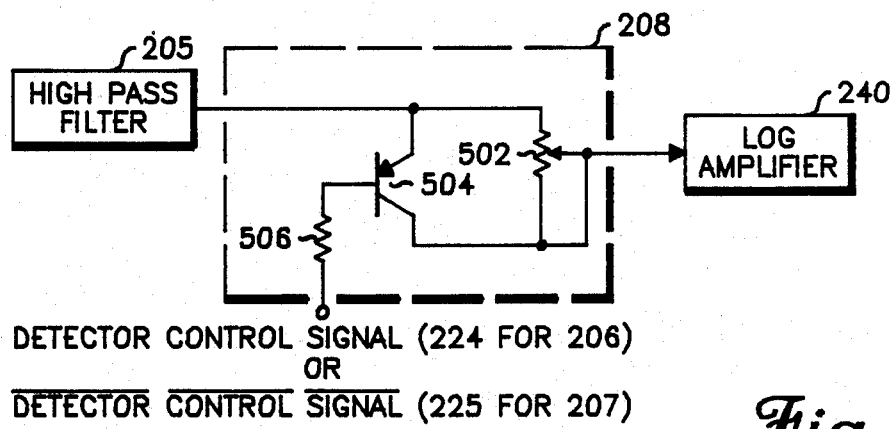
FIG. 5 is a detailed circuit diagram for the gain adjust circuitry 208 in FIG. 2.

According to a further feature of speakerphone 200, gain adjust circuitry 208 in FIG. 5 may be interposed between high pass filter 205 and the logarithmic amplifier 240 of the detectors 206 and 207 in FIG. 2 in order to further minimize syllabic attack time chopping. In the preferred embodiment, gain adjust circuitry 208 is bypassed by jumper 276 in the transmit signal detector 206. Referring to FIG. 5, gain adjust circuitry 208 includes a potentiometer 502, transistor 504 and resistor 506. Transistor 504 is turned on in response to a binary zero state of the detector control signal 224 for detector 206 or the $\overline{\text{detector control signal}}$ 225 for detector 207 in FIG. 2, and shorts out potentiometer 504 to increase the amount of gain. As a result of the higher signal gain, the sensitivity of one of the detectors 206 or 207 is increased by a pre-selected amount.

Figure 6:
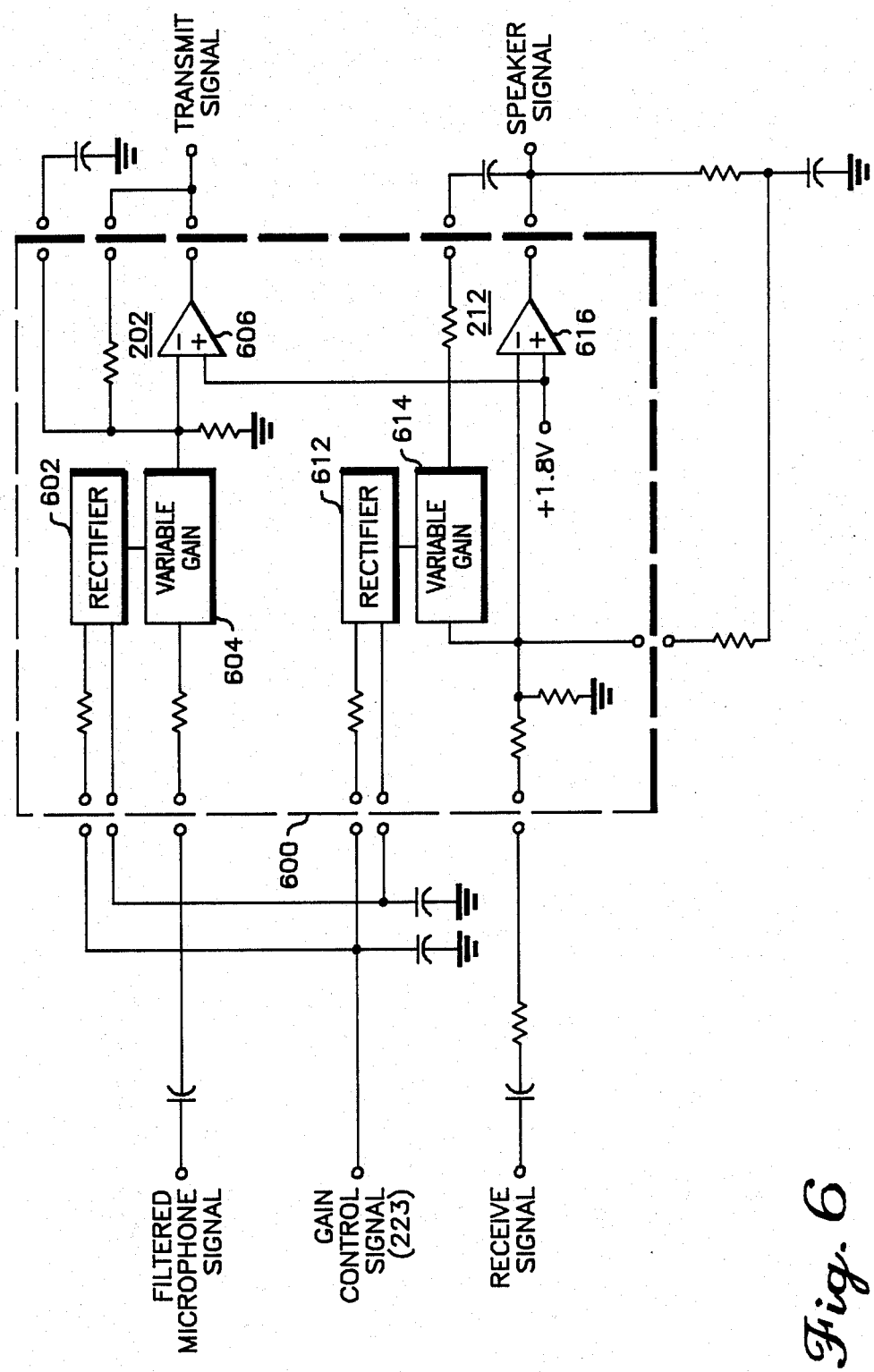
FIG. 6 is a detailed circuit diagram for the variable gain stages 202 and 212 in FIG. 2.

Referring next to FIG. 6, there is illustrated a detailed circuit diagram for the variable gain stages 202 and 212 in FIG. 2. In the preferred embodiment, a Signetics type NE570 compandor 600 is used for variable gain stages 202 and 212. The gain control signal 223 is coupled via resistors to rectifier cells 602 and 612 of compandor 600. The audio signals from the microphone are coupled to variable gain cell 604 in the input of operational amplifier 606 in stage 202. The audio signals from the receive signal are coupled to the input of operational amplifier 616 which has variable gain cell 614 in its feedback loop. Since both variable gain cells 604 and 614 are affected equally by changes in gain control signal 223, substantially equal but opposite changes in gain in deciBels (plus or minus 14 deciBels in the preferred embodiment) are produced in variable gain stages 202 and 212 of FIG. 2. That is, as the magnitude of the gain control signal 223 increases, the gain of the microphone signal is increased and the gain of the receive signal is decreased. In the preferred embodiment, changes in the magnitude of the gain control signal 223 are changes in current.

Figure 7:
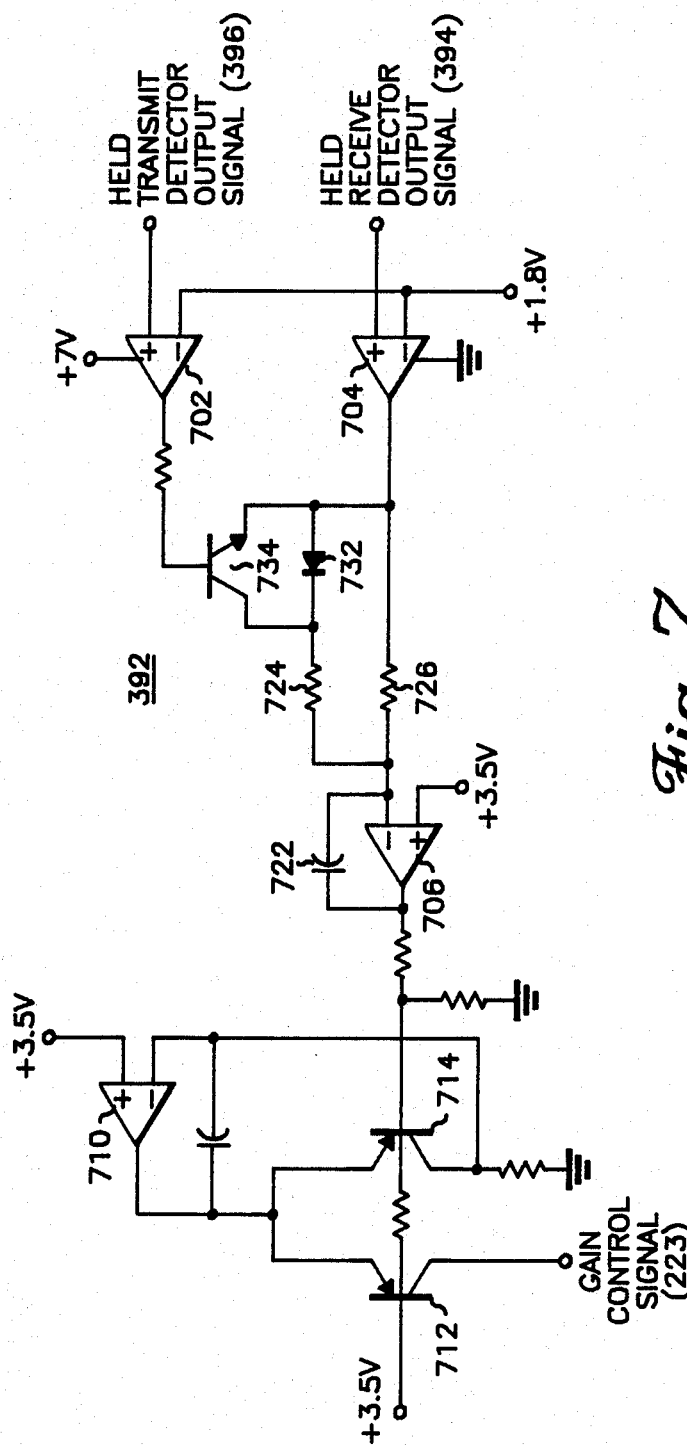
FIG. 7 is a detailed circuit diagram for the gain control circuitry 392 in FIG. 3.

Referring to FIG. 7, there is illustrated a detailed circuit diagram of the gain control circuitry 392 in FIG. 3. Operational amplifiers 702 and 704 act as comparators for the held output signals 394 and 396 from blocks 316 and 318 in FIG. 3, respectively. Operational amplifier 706 is arranged as an integrator. The dual time constants of gain control signal 223 are produced by capacitor 722 and resistors 724 and 726. When the output of amplifier 704 switches high (audio signals from receive signal 222 detected by detector 207), the time constant is determined by capacitor 722 and the parallel combination of resistors 724 and 726, typically 30 milliseconds. When the output of amplifier 704 switches low, the time constant is determined by capacitor 722 and resistor 726 since diode 732 is reverse biased, typically 500 milliseconds. When the hands-free party begins to talk and is detected by detector 206, the output of amplifier 702 will go high turning on transistor 734 and shorting out diode 732. Shorting out diode 732 changes the time constant by placing resistors 724 and 726 in parallel and reducing the time required for changing the gain control signal 223 to allow the hands-free party to be heard (i.e., time constant changes from typically 500 to 30 milliseconds). Amplifier 710 and transistors 712 and 714 convert the output of integrator 706 to changes in current of the gain control signal 223. The changes in current of the gain control signal 223 cause linear changes of substantially equal magnitude in the impedance of gain cells 604 and 614 in FIG. 6 which as previously described produces substantially equal but opposite gain changes in the variable gain stages 202 and 212 of FIG. 2.

Figure 8:
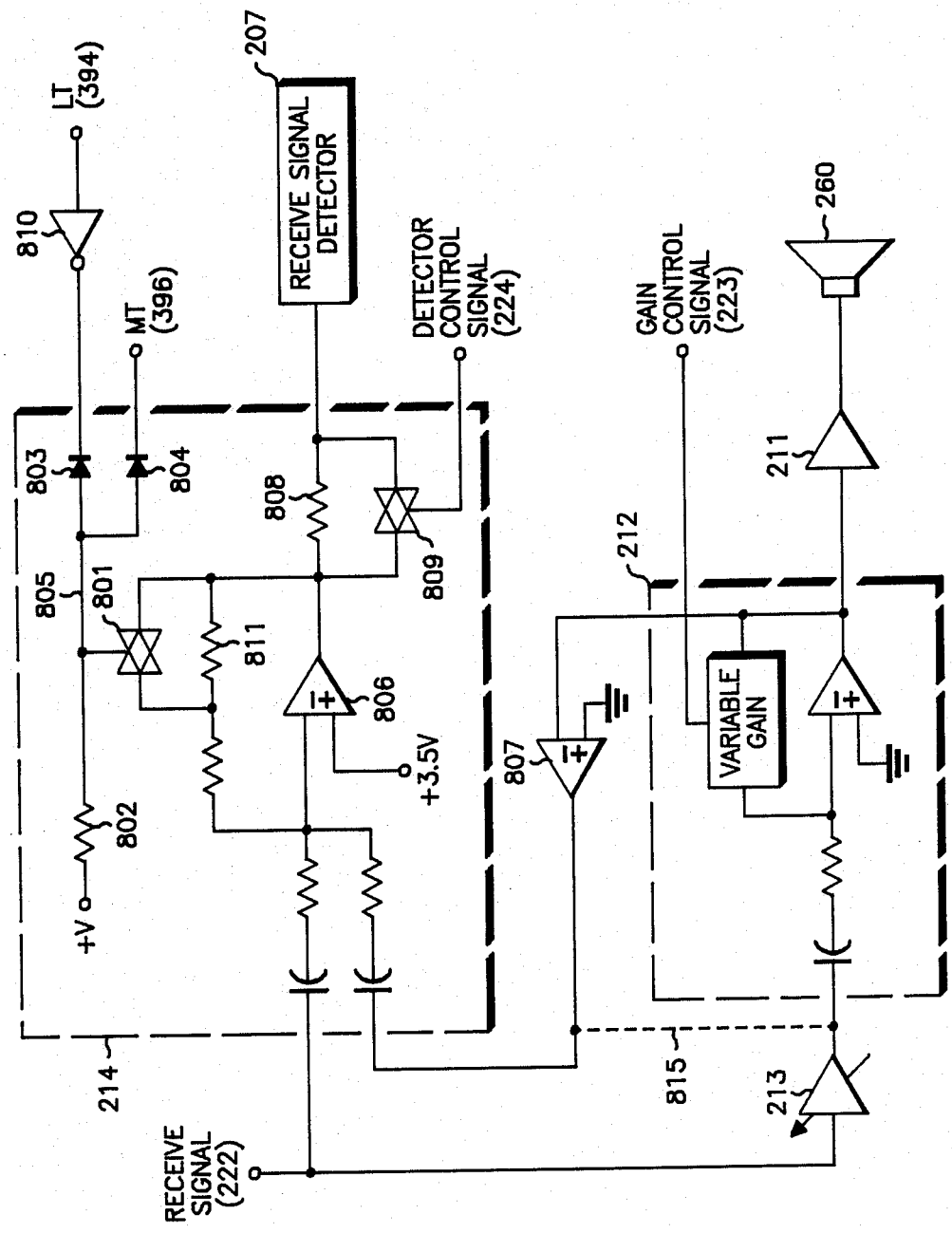
FIG. 8 is a detailed circuit diagram of an embodiment of summer 214 in FIG. 2.

Referring to FIG. 8, there is illustrated a detailed circuit diagram of an embodiment of summer 214 in FIG. 2 Receive signal 222 is coupled to amplifier 806 of summer 214 and to adjustable gain amplifier 213. Adjustable gain amplifier 213 is coupled to variable gain stage 212. The output of variable gain stage 212 is coupled to amplifier 807 which in turn is coupled to amplifier 806 of summer 214. Amplifier 807 applies a signal to summer 214 that is in phase with the receive signal 222. As shown by dashed line 815, amplifier 806 may be coupled to the output of adjustable gain amplifier 213 instead of amplifier 807.

Summer 214 in FIG. 8 includes gain adjust circuitry 808 and 809 and amplifier 806 having a switchable gain. Analog switch 809 is responsive to the high state of the detector control signal 224 for bypassing resistor 808 and producing higher gain in the receive path, when the land party's speech has been detected. Analog switch 801 is responsive to the low state of the LT signal 394 together with the high state of the MT signal 396 for bypassing resistor 811 to lower the gain of amplifier 806. Otherwise, analog switch 801 is off and the gain of amplifier 806 is higher. This operation of summer 214 suppresses echo of the mobile party speech which may otherwise cause receive signal detector 207 to incorrectly indicate that the land party's speech has been detected The logic circuit elements 302, 304, 306, 308, 310, 312 and 314 in FIG. 3 may be mechanized by utilizing the circuit elements in conventional integrated circuits, such as the CMOS integrated circuits described in the "CMOS Integrated Circuit Book", published by Motorola Semiconductor Products, Inc., Austin, Tex., 1978. Moreover, the logic circuit elements 302, 304, 306, 308, 310, 312 and 314 in FIG. 3 together with many of the resistors and capacitors of blocks 316, 318 and 392 may be readily integrated into a semiconductive substrate and packaged as a single integrated circuit device.

The improved speakerphone of the present invention may be advantageously utilized in a wide variety of applications requiring complete freedom of movement or multiple-party conference calls. For example, the improved speakerphone of the present invention can be utilized to provide hands-free communications to a mobile party in radiotelephone systems or to a land party in landline telephone systems. The speakerphone of the present invention can be adapted for wide variety of applications since the level of ambient background noise is taken into consideration.

We claim:

1. A speakerphone including a microphone and a speaker and being coupled to a communications path for applying to said communications path microphone audio signals and applying incoming audio signals from said communications path to said speaker, said speakerphone further comprising:

first amplifying means having a gain varying in predetermined proportion with a gain control signal for amplifying the incoming audio signals;

second amplifying means having a gain varying in opposite proportion to said predetermined proportion with the gain control signal for amplifying the microphone audio signals;

first detecting means having a predetermined response characteristic varying by a pre-selected amount in response to a detector control signal for detecting the presence of the incoming audio signals and producing an output signal;

second detecting means having a predetermined response characteristic varying by an amount opposite to said pre-selected amount in response to the detector control signal for detecting the presence of the microphone audio signals and producing an output signal;

first control means coupled to the output signal of said first detecting means for generating the gain control signal having a magnitude related to the output signal of said first detecting means, said first control means further including means coupled to to the first detecting means output signal for integrating the first detecting means output signal to produce an intergrated output signal, and means coupled to said integrating means for generating a gain control signal current having a magnitude related to the integrated output signal of said integrating means; and second control means coupled to the output signal of said first detecting means and the output signal of said second detecting means for generating the detector control signal.

2. The speakerphone according to claim 1, wherein said first amplifying means includes an operational amplifier having a feedback impedance and input impedance, and said second amplifying means includes an operational amplifier having a feedback impedance and input impedance, said input impedance of one of the first and second amplifying means varying with the gain control signal for varying said gain of said one of the first and second amplifying means, and said feedback impedance of the other of the first and second amplifying means varying with the gain control signal for varying said gain of said other of the first and second amplifying means.

3. The speakerphone according to claim 1, wherein said speaker audio signals include incoming background noise, said microphone audio signals include microphone background noise, said first detecting means includes means for detecting the incoming background noise and means for comparing the detected incoming background noise to the incoming audio signals for detecting the presence of the incoming audio signals, and said second detecting means includes means for detecting the microphone background noise and means for comparing the detected microphone background noise to the microphone audio signals for detecting the presence of the microphone audio signals.

4. The speakerphone according to claim 1, wherein said first detecting means includes attenuating means having a variable attenuation for attenuating the incoming audio signals, and said second detecting means includes low pass filter means having a variable passband for filtering the microphone audio signals, and attenuating means of the first detecting means having an attenuation varying by a pre-selected amount in response to the detector control signal, and said low pass filter means of the second detecting means having a passband varying by an amount opposite to said pre-selected amount of said attenuating means in response to the detector control signal.

5. The speakerphone according to claim 1, further including, interposed between the communications path and the first detecting means, third amplifying means for amplifying the incoming audio signals by a pre-selected gain and summing the incoming audio signals from the communications path and the amplified audio signals from the first amplifying means.

6. The speakerphone according to claim 5, wherein said third amplifying means has switchable first and second pre-selected gains, said speakerphone further including means for switching from said first pre-selected gain to said second pre-selected gain in response to the output signal of said second detecting means and switching from said second pre-selected gain to said first pre-selected gain in response to the output signal of said first detecting means.

* * * * *